United States Patent
Jang

(10) Patent No.: US 7,867,870 B2
(45) Date of Patent: Jan. 11, 2011

(54) SEMICONDUCTOR DEVICE AND METHOD FOR FORMING DEVICE ISOLATION FILM OF SEMICONDUCTOR DEVICE

(75) Inventor: Won Bong Jang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 501 days.

(21) Appl. No.: 11/931,042

(22) Filed: Oct. 31, 2007

(65) Prior Publication Data

US 2009/0001505 A1 Jan. 1, 2009

(30) Foreign Application Priority Data

Jun. 29, 2007 (KR) .................... 10-2007-0065548

(51) Int. Cl.
*H01L 21/76* (2006.01)

(52) U.S. Cl. .................. 438/421; 438/424; 438/430; 438/631; 438/633; 438/637; 438/645; 438/675; 438/697; 438/294; 438/296; 257/244; 257/374; 257/446; 257/510; 257/513; 257/E21.573; 257/E21.577; 257/E21.58; 257/E21.581; 257/E21.583

(58) Field of Classification Search ............. 257/93, 257/117, 244, 374, 446, 506, 501, 510, 513, 257/524, 622, 725, E21.56, E21.565, E21.206, 257/E21.54, E21.545, E21.553, E21.573, 257/E21.574, E21.577, E21.58, E21.581, 257/E21.583, E29.02; 438/218, 219, 221, 438/248, 294–296, 353, 355, 359, 361, 391, 438/404, 421, 424, 427, 430, 443, 444, 631, 438/633, 637, 645, 675, 697

See application file for complete search history.

(56) References Cited

U.S. PATENT DOCUMENTS

| | | | | |
|---|---|---|---|---|
| 5,903,040 A | * | 5/1999 | Hong | 257/510 |
| 2003/0006476 A1 | * | 1/2003 | Chen et al. | 257/510 |
| 2005/0079730 A1 | * | 4/2005 | Beintner et al. | 438/758 |
| 2005/0280007 A1 | * | 12/2005 | Hsu et al. | 257/79 |
| 2007/0134884 A1 | | 6/2007 | Kim et al. | 438/424 |

\* cited by examiner

*Primary Examiner*—Lynne A Gurley
*Assistant Examiner*—Meiya Li
(74) *Attorney, Agent, or Firm*—Marshall, Gerstein & Borun LLP

(57) ABSTRACT

A device isolation film in a semiconductor device and a method for forming the same are provided. The method includes etching a middle portion of a device isolation film having a deposition structure including a Spin-On-Dielectric (SOD) oxide film and a High Density Plasma (HDP) oxide film to form a hole and filling an upper portion of the hole with an oxide film having poor step coverage characteristics to form a second hole extending along the middle portion of the device isolation film. The second hole serves as a buffer for stress generated at the interface between an oxide film, which can be a device isolation film, and a silicon layer, which can be a semiconductor substrate, thereby increasing the operating current of a transistor and improving the electrical characteristics of the resulting device.

20 Claims, 4 Drawing Sheets

SEMICONDUCTOR DEVICE AND METHOD FOR FORMING DEVICE ISOLATION FILM OF SEMICONDUCTOR DEVICE

CROSS-REFERENCE TO RELATED APPLICATION

Priority to Korean patent application number 10-2007-0065548, filed on Jun. 29, 2007, which is incorporated by reference in its entirety, is claimed.

BACKGROUND OF THE INVENTION

The invention relates to a semiconductor device and a method for forming a device isolation film in a semiconductor device.

As semiconductor devices become smaller, it is important to improve their operating speed via process development. As a result, many process technologies have been developed. Specifically, a process for forming a device isolation film in a DRAM is an important semiconductor manufacturing process.

Generally, the process for forming a device isolation film is a initial step in all semiconductor manufacturing processes to determine the size of an active region and the process margin of subsequent steps.

A Local Oxidation of Silicon (LOCOS) method has been widely used to form a device isolation film. However, the LOCOS process decreases the active region size due to a Bird's beak phenomenon that degrades the electrical characteristics of the device.

In order to prevent the degradation, a Shallow Trench Isolation (STI) process has been widely used to form a device isolation film.

The STI process results in poor trench gap fill characteristics and can cause trench voids. As a result, it is necessary to prevent the generation of voids.

FIGS. 1a to 1c are cross-sectional diagrams illustrating a conventional method for forming a device isolation film in a semiconductor device.

Referring to FIG. 1a, a pad oxide film and a pad nitride film are deposited over a semiconductor substrate 100. The resulting structure is selectively etched to form a pad oxide pattern 110 and a pad nitride pattern 120 that define a device isolating trench 130.

The semiconductor substrate 100 is dry-etched with the pad oxide pattern 110 and the pad nitride pattern 120 to form the device isolating trench 130.

Referring to FIG. 1b, a Spin-On-Dielectric (SOD) oxide film 140 is formed to fill a bottom portion of the trench 130.

The SOD oxide film 140 reduces the generation of voids resulting from filling defects in a narrow pattern region.

Referring to FIG. 1c, a High Density Plasma (HDP) oxide film 150 is formed over the SOD oxide film 140 to fill the remaining, upper portion of the trench 130.

A chemical-mechanical (CMP) process is performed to planarize the HDP oxide film 150 until the pad oxide pattern 120 is exposed.

As a result, a device isolation film is formed to have a deposition structure including the SOD oxide film 140 and the HDP oxide film 150 in the trench 130.

As mentioned above, a two-layered device isolation film inhibits generation of voids in a trench. However, if the critical dimension of a trench that defines the device isolation film is narrow, there is an increase the stress that an SOD oxide film applies to the sidewalls of the trench. As a result, the SOD oxide film applies a tensile stress to a PMOS semiconductor device and degrades the mobility of a carrier, thereby reducing the operating current of a DRAM device and degrading the electrical characteristics of a semiconductor device.

SUMMARY OF THE INVENTION

Various embodiments of the invention are provide a semiconductor device and a method for forming a device isolation film in a semiconductor device.

According to an embodiment of the invention, a method for forming a device isolation film includes: etching a semiconductor substrate to form a device isolating trench; filling the trench with a device isolation film; etching the device isolation film to form a hole that exposes the semiconductor substrate in the device isolating trench; and forming an oxide film to fill an upper portion of the hole.

Preferably, the device isolation film has a deposition structure including comprising a first oxide film and a second oxide film.

According to another embodiment of the invention, a method for forming a device isolation film includes: etching a semiconductor substrate to form a device isolating trench; forming a first oxide film in a lower portion of the trench; forming a second oxide film in an upper portion of the trench and over the first oxide film, and then to planarizing the second oxide film, thereby forming a device isolation film filling the trench; etching the first and second oxide films to form a hole that exposes the semiconductor substrate in the device isolating trench; and forming a third oxide film to fill an upper portion of the hole.

Preferably, the first oxide film comprises a Spin-On-Dielectric (SOD) oxide film.

Preferably, formingathe firstoxidefilm comprises: forming a first oxide film in the trench and performing a wet etching process to partially etch the first oxide film in the trench.

Preferably, the second oxide film is selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof.

Preferably, formingathe thirdoxidefilm comprises: forming a third oxide film over the semiconductor substrate and the second oxide film including the hole; and performing a Chemical Mechanical Polishing (CMP) process to expose the second oxide film, thereby filling only the upper portion of the hole.

Prefereably, the third oxide film comprises an Un-doped Silica Glass (USG) oxide film. Comprising forming the third oxide film to have a thickness in a range from about 500 Å to about 1000 Å.

According to another embodiment of the invention, a device isolation film of a semiconductor device the film comprising a device isolating trench formed in a semiconductor substrate, a deposition structure comprising a first oxide film and second oxide film filling the trench, a hole formed in the device isolating trench to expose the semiconductor substrate, and a third oxide film to fill an upper portion of the hole.

Preferably, the first oxide film includes a SOD oxide film.

Preferably, the second oxide film is selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof.

The third oxide film includes a USG oxide film.

DETAILED DESCRIPTION OF THE SPECIFIC EMBODIMENT

FIGS. 2a to 2d are cross-sectional diagrams illustrating a method for forming a device isolation film in a semiconductor device according to an embodiment of the invention.

Figure 1A:
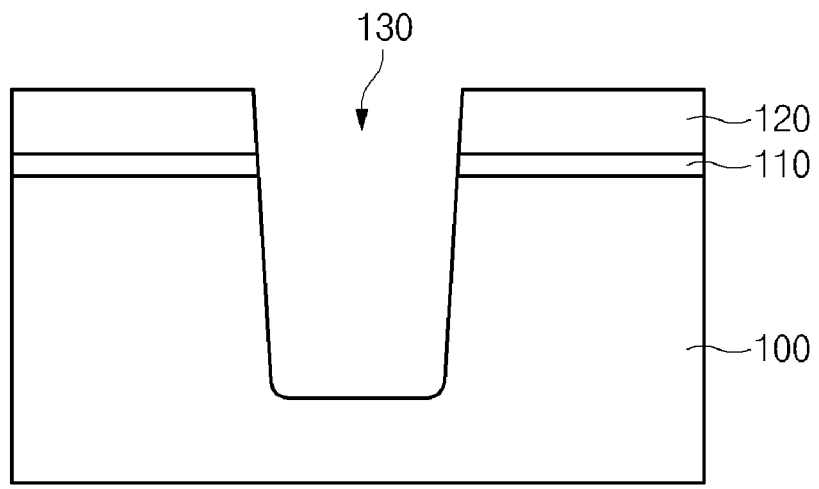
FIGS. 1a to 1c are cross-sectional diagrams illustrating a conventional method for forming a device isolation film in a semiconductor device.
Figure 1B:
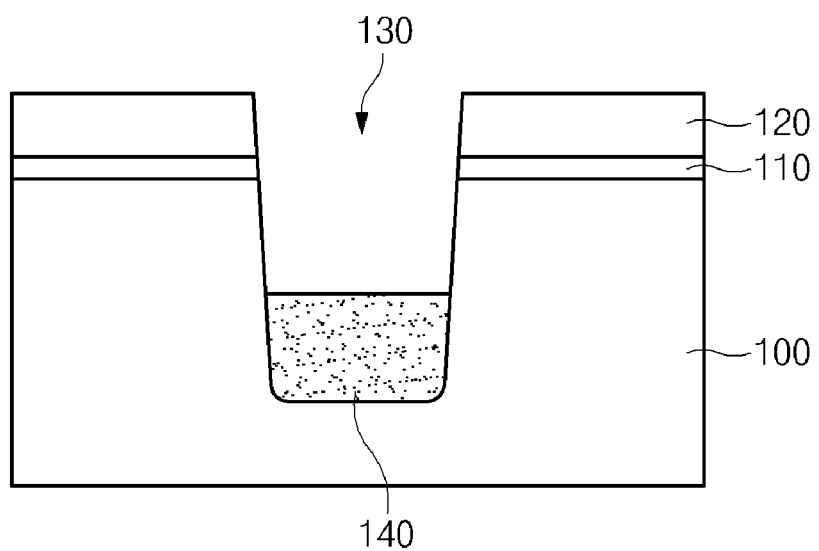
Figure 1C:
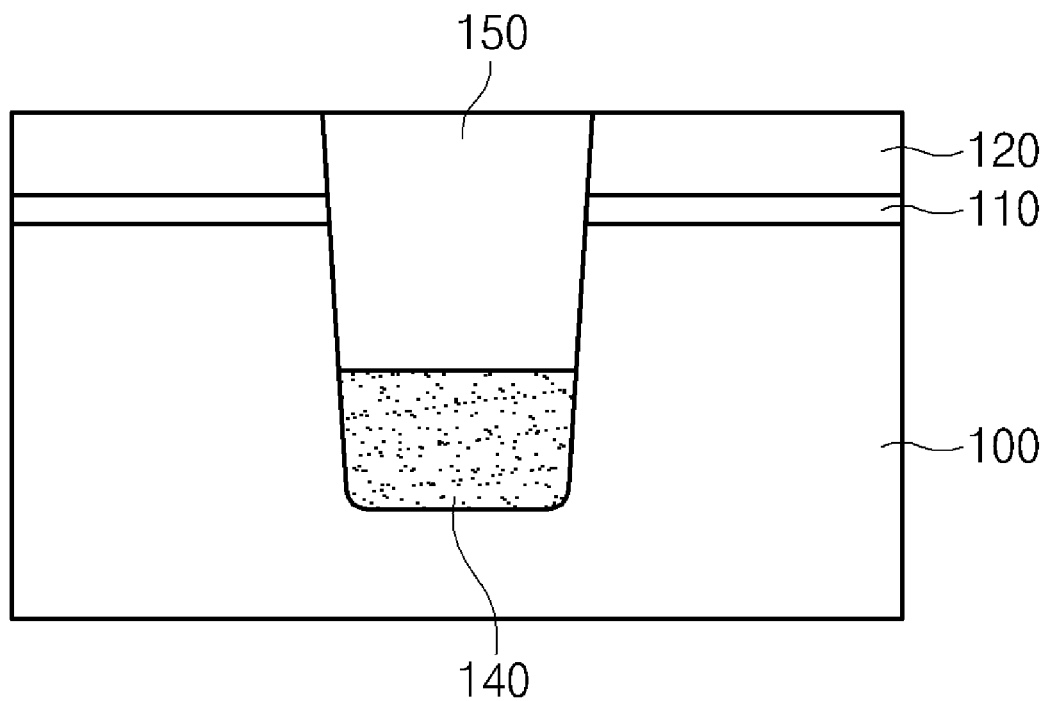
Figure 2A:
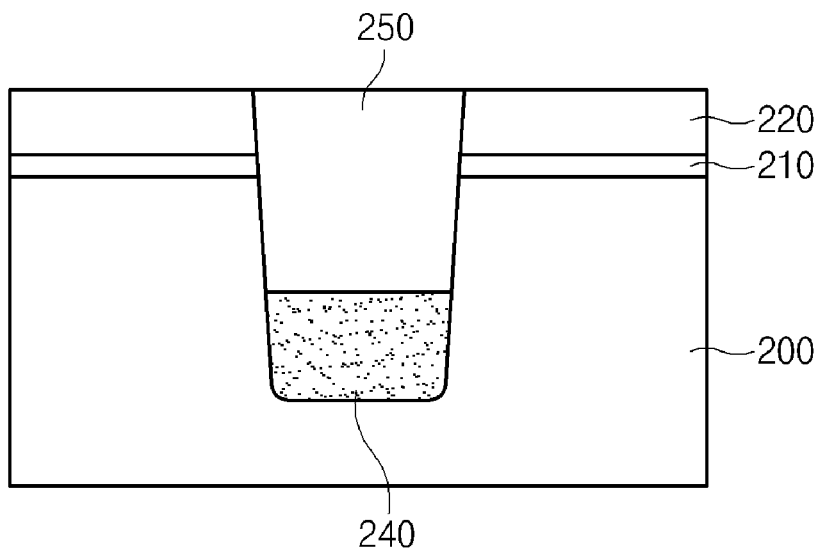
FIGS. 2a to 2d are cross-sectional diagrams illustrating a method for forming a device isolation film in a semiconductor device according to an embodiment of the invention.

Referring to FIG. 2a, a pad oxide film 210 and a pad nitride film 220 are sequentially formed over a semiconductor substrate 200. The pad nitride film 220 and the pad oxide film 210 are selectively etched to form a pad nitride pattern 220 and a pad oxide pattern 210 that define a device isolating trench.

The semiconductor substrate 200 is etched to a given depth using the pad nitride pattern 220 and the pad oxide pattern 210 as a mask to form the device isolating trench that defines an active region.

An insulating film (not shown) is preferably formed in the semiconductor substrate 200 on the sidewalls and bottom of the device isolating trench. The insulating film improves device isolating characteristics and refresh characteristics, and prevents leakage currents.

A first oxide film 240 is formed in the device isolating trench. A wet etching process is performed to partially etch the first oxide film 240 in an upper portion of the trench so that the first oxide film 240 remains in and fills only a lower portion of the trench.

The first oxide film is preferably a Spin-On-Dielectric (SOD) oxide film. The SOD oxide film has excellent gap-fill characteristics when used to form a device isolation film.

A second oxide film 250 is formed over the resulting structure including the trench having the first oxide film 240 and the pad nitride pattern 220.

A Chemical-Mechanical Polish (CMP) process is performed to remove a portion of the second oxide film 250 and expose the pad nitride pattern 220, thereby forming a device isolation film including both the first and second oxide films 240, 250.

The second oxide film 250 is preferably selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof.

Figure 2B:
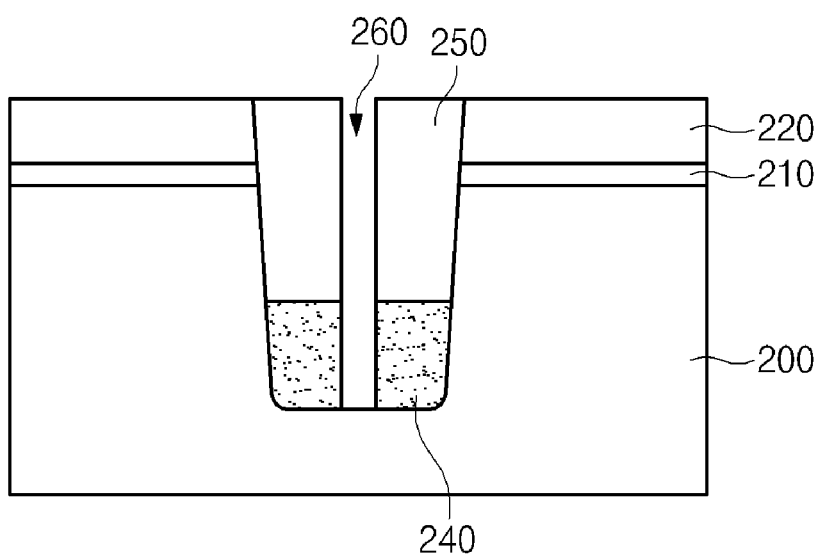

Referring to FIG. 2b, a photoresist pattern (not shown) having a hole-type pattern is formed over a middle portion of the device isolation film.

The second oxide film 250 and the first oxide film 240 are etched using the hole-type photoresist pattern as a mask to form a first hole 260 that exposes the semiconductor substrate 200 in the lower portion of the trench.

The photoresist pattern is then removed.

Figure 2C:
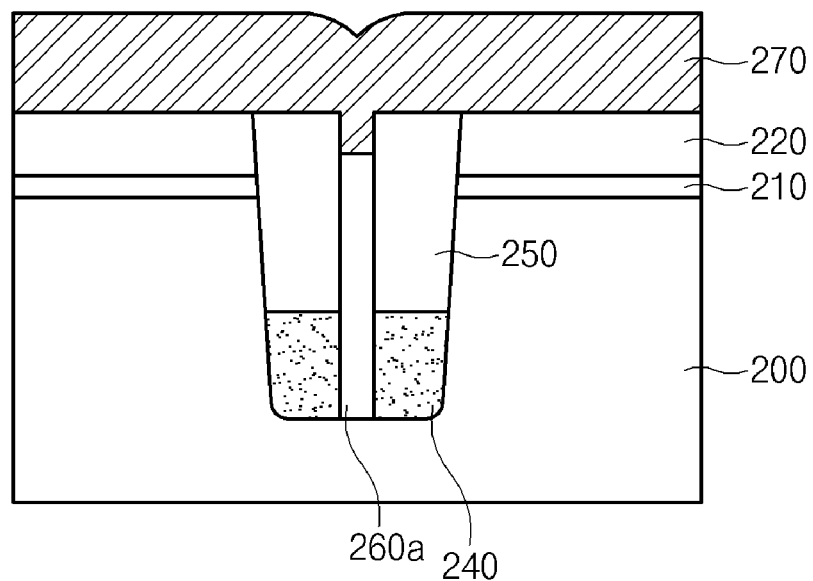

Referring to FIG. 2c, a third oxide film 270 is formed over the semiconductor substrate 200 including the first hole 260, for example on the pad nitride pattern 220 and the device isolation film.

The third oxide film 270 is preferably an Un-doped Silica Glass (USG) oxide film. The USG oxide film does not completely fill the first hole 260. Instead, the USG oxide film is deposited over the first hole 260 and only fills an upper portion of the first hole 260 due to the poor step coverage characteristics of the USG oxide film.

The third oxide film 270 is formed to have a height in a range from about 500 Å to about 1000 Å extending above the upper surface of the pad nitride pattern 220.

Figure 2D:
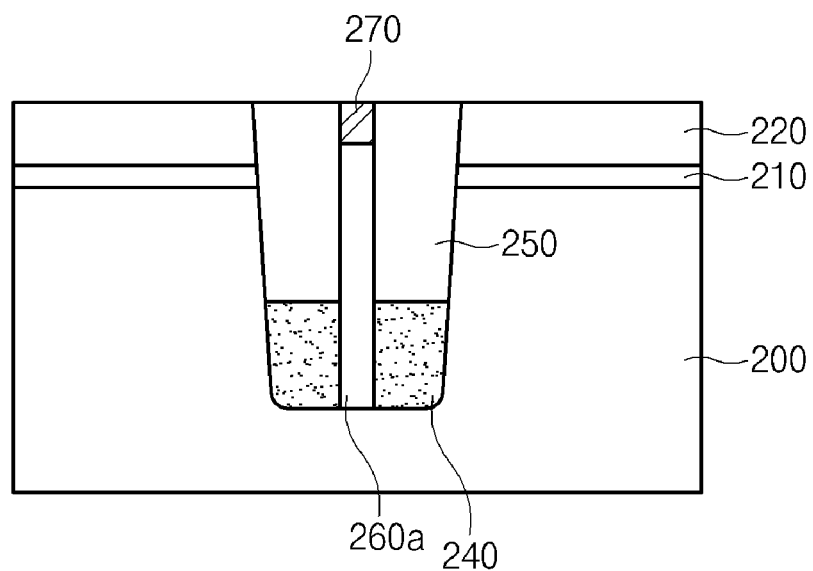

Referring to FIG. 2d, a planarization process is performed to remove a portion of the third oxide film 270, and to expose the second oxide film 250 and the pad nitride pattern 220. The planarization process preferably includes a CMP process.

After the planarization process, the third oxide film 270 remains in the upper portion of the first hole 260 so that a second hole 260a remains in the device isolation film.

The second hole 260a extends along the middle and bottom portions of the device isolation film. The second hole 260a serves as a stress buffer for buffering stress generated at the interface between the semiconductor substrate 200 and the first and second oxide films 240, 250.

A semiconductor device formed according to the above-described method has a trench in a device isolation region of a semiconductor substrate. The trench is filled by a deposition structure (e.g., a device isolation film) including a first oxide film and a second oxide film.

A hole to expose the semiconductor substrate in the trench is formed through the second oxide film and the first oxide film. A third oxide film is formed over the hole.

The first oxide film is preferably a SOD oxide film. The second oxide film is preferably selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof. The third oxide film is preferably a USG oxide film.

The hole serves as a stress buffer for buffering stress generated at the interface between an oxide film (e.g., the device isolation film) and a silicon layer (e.g., the semiconductor substrate), thereby improving the electrical characteristics of the device.

As described above, according to an embodiment of the invention, a method for forming a device isolation film of a semiconductor device includes etching a middle portion of a device isolation film having a deposition structure including a SOD oxide film and a HDP oxide film to form a hole and filling an upper portion of the hole with an oxide film having poor step coverage characteristics to form a second hole extending along the middle and bottom portions of the device isolation film. The hole serves as a buffer for stress generated at the interface between an oxide film (e.g., a device isolation film) and a silicon layer (e.g., a semiconductor substrate), thereby increasing the operating current of a transistor and improving the electrical characteristics of the device.

The above embodiments of the invention are illustrative and not limiting. Various alternatives and equivalents are possible. The invention is not limited by the lithography steps described herein. Nor is the invention limited to any specific type of semiconductor device. For example, the invention may be implemented in a dynamic random access memory (DRAM) device or non-volatile memory device. Other additions, subtractions, or modifications may be made in view of the disclosure and are intended to fall within the scope of the appended claims.

What is claimed is:

1. A method for forming a device isolation film, the method comprising:
   etching a semiconductor substrate to form a device isolating trench;
   filling the device isolating trench with a device isolation material;
   etching the device isolation material to form a hole that exposes the semiconductor substrate in the device isolating trench; and
   forming an oxide film to fill only an upper portion of the hole.

2. The method according to claim 1, wherein the device isolation material has a deposition structure comprising a first oxide film and a second oxide film.

3. A method for forming a device isolation film, the method comprising:
   etching a semiconductor substrate to form a device isolating trench;
   forming a first oxide film in a lower portion of the device isolating trench;
   forming a second oxide film in an upper portion of the device isolating trench and over the first oxide film, and then planarizing the second oxide film;
   etching the first oxide film and second oxide film to form a hole that exposes the semiconductor substrate in the device isolating trench; and
   forming a third oxide film to fill only an upper portion of the hole.

4. The method according to claim 3, wherein the first oxide film comprises a Spin-On-Dielectric (SOD) oxide film.

5. The method according to claim 3, wherein forming the first oxide film comprises: forming a device isolation material in the device isolating trench and performing a wet etching process to partially etch the device isolation material in the device isolating trench.

6. The method according to claim 3, wherein the second oxide film is selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof.

7. The method according to claim 3, wherein forming the third oxide film comprises:
   forming the third oxide film over the semiconductor substrate and the second oxide film including the hole; and
   performing a Chemical Mechanical Polishing (CMP) process to expose the second oxide film, thereby filling only the upper portion of the hole.

8. The method according to claim 3, wherein the third oxide film comprises an Un-doped Silica Glass (USG) oxide film.

9. The method according to claim 3, comprising forming the third oxide film to a thickness in a range from about 500 Å to about 1000 Å.

10. A device isolation film of a semiconductor device, the film comprising:
    a device isolating trench formed in a semiconductor substrate;
    a deposition structure comprising a first oxide film and a second oxide film filling the device isolating trench wherein the first oxide film formed in a lower portion of the device isolating trench,
    the second oxide film formed in an upper portion of the device isolating trench and over the first oxide film;
    a hole formed in the device isolating trench and extending along the length of the deposition structure, the hole exposing the semiconductor substrate; and
    a third oxide film filling an upper portion of the hole to form a void in the inside of the hole.

11. The device isolation film according to claim 10, wherein the first oxide film comprises a Spin-On-Dielectric (SOD) oxide film.

12. The device isolation film according to claim 10, wherein the second oxide film is selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof.

13. The device isolation film according to claim 10, wherein the third oxide film comprises an Un-doped Silica Glass (USG) oxide film.

14. A method for forming a device isolation film, the method comprising:
    etching a semiconductor substrate to form a device isolating trench;
    forming a first oxide film in a lower portion of the device isolating trench;
    forming a second oxide film in an upper portion of the device isolating trench and over the first oxide film, and then planarizing the second oxide film;
    etching the first oxide film and second oxide film to form a hole that exposes the semiconductor substrate in the device isolating trench; and
    forming a third oxide film in the upper portion of the hole to form a void in the inside of the hole.

15. The method according to claim 14, wherein the first oxide film comprises a Spin-On-Dielectric (SOD) oxide film.

16. The method according to claim 14, wherein forming the first oxide film comprises: forming a device isolation material in the device isolating trench and performing a wet etching process to partially etch the device isolation material in the device isolating trench.

17. The method according to claim 14, wherein the second oxide film is selected from High Density Plasma (HDP), Low Pressure-Tetra Ethyl Ortho Silicate (LP-TEOS), Plasma Enhanced-Tetra Ethyl Ortho Silicate (PE-TEOS), and combinations thereof.

18. The method according to claim 14, wherein forming the third oxide film comprises:
    forming the third oxide film over the semiconductor substrate and the second oxide film including the hole; and
    performing a Chemical Mechanical Polishing (CMP) process to expose the second oxide film, thereby filling only the upper portion of the hole.

19. The method according to claim 14, wherein the third oxide film comprises an Un-doped Silica Glass (USG) oxide film.

20. The method according to claim 14, comprising forming the third oxide film to a thickness in a range from about 500 Å to about 1000 Å.

* * * * *